(12) United States Patent
He et al.

(10) Patent No.: US 11,452,239 B2
(45) Date of Patent: Sep. 20, 2022

(54) METHOD FOR ENHANCING BOILING PERFORMANCE OF CHIP SURFACE

(71) Applicant: SUGON DATAENERGY(BEIJING) CO., LTD, Beijing (CN)

(72) Inventors: Jisheng He, Beijing (CN); Chen Wang, Beijing (CN); Peng Zhang, Beijing (CN); Hongjie Wu, Beijing (CN); Jingnan Peng, Beijing (CN); Xing Li, Beijing (CN); Zhen Sun, Beijing (CN); Xintao Cui, Beijing (CN)

(73) Assignee: SUGON DATAENERGY(BEIJING) CO., LTD, Beijing (CN)

( * ) Notice: Subject to any disclaimer, the term of this patent is extended or adjusted under 35 U.S.C. 154(b) by 285 days.

(21) Appl. No.: 16/618,181

(22) PCT Filed: Dec. 26, 2017

(86) PCT No.: PCT/CN2017/118555
§ 371 (c)(1),
(2) Date: Nov. 29, 2019

(87) PCT Pub. No.: WO2018/218943
PCT Pub. Date: Dec. 6, 2018

(65) Prior Publication Data
US 2020/0113084 A1 Apr. 9, 2020

(30) Foreign Application Priority Data
Jun. 1, 2017 (CN) .......................... 201710403898.0

(51) Int. Cl.
*F28D 15/00* (2006.01)
*H05K 7/20* (2006.01)
*G06F 1/20* (2006.01)

(52) U.S. Cl.
CPC .......... *H05K 7/20336* (2013.01); *G06F 1/20* (2013.01)

(58) Field of Classification Search
CPC ............. H05K 7/20336; H05K 7/2089; H05K 7/20936; G06F 1/20
(Continued)

(56) References Cited

U.S. PATENT DOCUMENTS 9,746,247 B2 * 8/2017 Edwards ................ F28F 13/003
10,077,945 B2 * 9/2018 Lan ........................ F28D 15/046
(Continued)

FOREIGN PATENT DOCUMENTS

CN          102506600 A      6/2012
CN          102601372 A  *   7/2012
(Continued)

OTHER PUBLICATIONS

International Search Report of PCT Patent Application No. PCT/CN2017/118555 dated Mar. 23, 2018.

*Primary Examiner* — Claire E Rojohn, III

(57) ABSTRACT

The present invention relates to a method for enhancing boiling performance of chip surface comprising steps of mounting a heat pipe directly above the surface of the chip, and forming a porous structure for increasing the vaporization core on an upper surface of the heat pipe. Performing an enhancing treatment in boiling of the upper surface of the heat pipe by mounting the heat pipe directly above the chip makes a temperature field of the boiling surface uniform, increases the boiling area and vaporization core, strengthens the boiling heat transfer, and reduces the core temperature of the chip.

10 Claims, 3 Drawing Sheets

(58) Field of Classification Search
USPC .................................. 165/104.26, 104.33
See application file for complete search history.

(56) References Cited

U.S. PATENT DOCUMENTS

| | | | |
|---|---|---|---|
| 10,415,890 B2* | 9/2019 | Ahamed | F28D 15/0233 |
| 2004/0127614 A1* | 7/2004 | Jiang | C09J 7/20 |
| | | | 524/270 |
| 2005/0100728 A1* | 5/2005 | Ristic-Lehmann | B32B 15/08 |
| | | | 524/544 |
| 2007/0251410 A1* | 11/2007 | Rissanen | B23K 1/19 |
| | | | 106/1.13 |
| 2009/0040726 A1* | 2/2009 | Hoffman | F28D 15/0233 |
| | | | 29/890.032 |
| 2012/0325440 A1* | 12/2012 | Honmura | F28D 15/046 |
| | | | 165/104.26 |
| 2016/0091258 A1* | 3/2016 | Ahamed | F28D 15/0233 |
| | | | 165/104.26 |
| 2016/0295739 A1* | 10/2016 | Ahamed | F28D 15/046 |
| 2017/0055372 A1* | 2/2017 | Ahamed | H01L 23/427 |
| 2019/0131204 A1* | 5/2019 | Gaskill | G06F 1/203 |
| 2020/0113084 A1* | 4/2020 | He | G06F 1/20 |

FOREIGN PATENT DOCUMENTS

| | | |
|---|---|---|
| CN | 102601372 A | 7/2012 |
| CN | 106455446 A | 2/2017 |

\* cited by examiner

METHOD FOR ENHANCING BOILING PERFORMANCE OF CHIP SURFACE

FIELD OF THE APPLICATION

The present invention relates to the technical field of computer, in particular, to method for enhancing boiling performance of chip surface.

BACKGROUND

Most common computers rely on cold air to cool the machine. The water-cooling or liquid-cooling has two advantages of directly guiding coolant to the heat source instead of indirect cooling like air-cooling, and the heat transferred per unit volume i.e. heat dissipation efficiency being as high as 3500 times as compared with the air-cooling.

In terms of thermal principle, evaporative cooling is using vaporization latent heat when the fluid boils to take way the heat. This cooling method using the latent heat of vaporization when the fluid is boiled is called "evaporation cooling". Since the vaporization latent heat of the fluid is much larger than the specific heat, the cooling effect of evaporative cooling is more remarkable.

In the direct liquid-cooling system, that is, when the refrigerant is used for immersed cooling, the fins and the fan are eliminated, and only the phase change of the refrigerant is used for heat transfer to cool the CPU. The processing method of the heat transfer area, surface roughness, material properties and the degree of usage can affect the strength of heat transfer by boiling. When the same liquid is boiled and heat-transferred on a polished wall, its heat transfer coefficient is lower than that when it is boiled and heat-transferred on the rough surface, which is mainly due to the fact that the vaporization core on the smooth surface is less.

At present, as shown in FIG. 1, the existing CPU chip on the market is disposed inside the CPU cover, wherein the CPU cover is made of copper, and the surface is coated with a layer of nickel, but the aluminum coated with copper has a smooth surface, which is not conducive to vaporization. Thus, the surface of the outer cover of the existing CPU chip is smooth, bubbles are not easily generated, and the boiling performance is not good enough. Therefore, the temperature of the CPU rises rapidly after the power is turned on, the steady-state temperature is high, so that the limit temperature of the CPU is easily to reach, which makes most server manufacturers dare not to use the liquid-cooling technology.

SUMMARY OF THE APPLICATION

For the drawbacks of the prior art, the present invention provides a method for enhancing boiling performance of chip surface, which may greatly increase the number of bubble vaporization cores, significantly improve boiling heat transfer, enhance boiling, save energy save, and has an efficient heat dissipation.

In order to achieve the object of the present invention, the present invention provides a method for enhancing boiling performance of chip surface, comprising steps of mounting a heat pipe directly above the surface of the chip; forming a porous structure for increasing the vaporization core on an upper surface of the heat pipe.

According to some embodiments of the present application, the heat pipe is a flat heat pipe.

According to some embodiments of the present application, the porous structure is formed by a method of sintering metal particles.

According to some embodiments of the present application, the metal particles are copper particles or copper silver plated particles.

According to some embodiments of the present application, the porous structure is directly sintered on the upper surface of the heat pipe.

According to some embodiments of the present application, the porous structure is sintered on a thin copper sheet that is welded to the upper surface of the heat pipe by a method of low temperature welding.

According to some embodiments of the present application, the porous structure is formed by a wire and mesh structure, a micro-ribbed column, a super hydrophobic surface or a foamed copper.

According to some embodiments of the present application, the porous structure is directly formed on the upper surface of the heat pipe.

According to some embodiments of the present application, the porous structure is formed on a thin copper sheet that is welded to the upper surface of the heat pipe by a method of low temperature welding.

According to some embodiments of the present application, the chip is a CPU chip.

In the present invention, performing an enhancing treatment in boiling of the upper surface of the heat pipe by mounting the heat pipe directly above the chip makes a temperature field of the boiling surface uniform, increases the boiling area and vaporization core, strengthens the boiling heat transfer, and reduces the core temperature of the chip.

Figure 1:
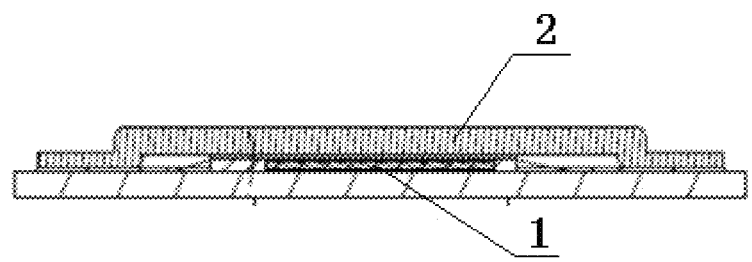
FIG. 1 shows a section view showing an installation structure of CPU in the prior art.

Description of reference numerals: 1—CPU chip, 2—CPU cover, 3—heat pipe, 4—porous structure.

DETAILED DESCRIPTION

To make the purpose, technical solutions and advantages of the present invention clearer, the embodiments of the present invention will be described below in detail in combination with the drawings. It should be noted that, in the case of no conflicts, the embodiments in the present invention and features in the embodiments can be combined mutually and arbitrarily.

In order to better understand the present invention, the following common words in the art are introduced.

Sintering refers to the conversion of a powdery material into a dense body, wherein after the powder is formed, the dense body obtained by sintering is a polycrystalline material with a microstructure composed of crystals, vitreous bodies and pores. The sintering process directly affects the grain size, pore size and grain boundary shape and distribution in the microstructure, which in turn affects the properties of the material.

Heat pipe makes full use of the principle of heat conduction and the rapid heat transfer property of the phase change medium, wherein the heat of the heat generating object is quickly transferred outside the heat source through the heat pipe, and the heat conduction capacity for the heat pipe exceeds the heat conduction capacity of any known metal.

Wire and mesh, the wire mainly refers to a wire processed from metal, synthetic fiber, etc., and the mesh is a mesh of different shapes, densities and specifications made by weaving or stamping according to different methods using silk, metal sheets, strips, etc.

Figure 2:
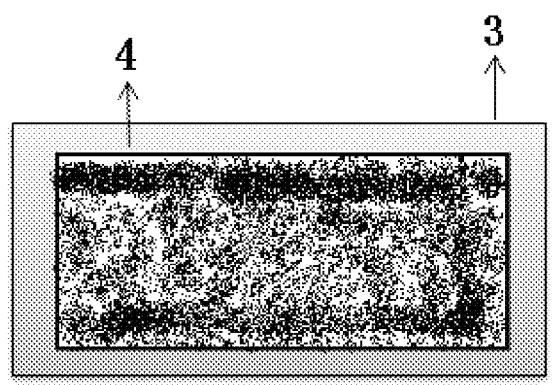
FIG. 2 shows a view showing a sintered porous structure of the upper surface of the heat pipe according to an embodiment of the present invention.

According to an embodiment of the present invention, a method for enhancing boiling performance of chip surface is provided, comprising steps of mounting a heat pipe 3 directly above the surface of the chip, and forming a porous structure 4 for increasing the vaporization core on an upper surface of the heat pipe 3. As shown in FIG. 2, by making full use of the principle of heat conduction and the rapid heat transfer property of the phase change medium, the heat of the heat generating object is quickly transferred outside the heat source through the heat pipe, and the heat conduction capacity for the heat pipe exceeds the heat conduction capacity of any known metal. The flat heat pipe may distribute the heat generated by the heat source on the upper surface, so that the heat flow is evenly distributed, the hot spot is eliminated, and the heat transfer area is increased.

A porous structure 4 is formed by sintering on the upper surface of the heat pipe 3, thereby increasing the boiling area, increasing the vaporization core, and lowering the nuclear temperature of the heat source for the chip.

The porous structure 4 is formed by powder sintering, wherein sintering into a porous surface using the powder is made by:

first removing the rust and grease from the surface of the substrate, then applying a layer of adhesive solution, the adhesive including polypropylene, polyethylene, polystyrene, polyethylene terephthalate, polymethacrylic acid, acetone or xylene; applying a metal powder evenly to the surface of the substrate, placing in a sintering furnace after drying the adhesive solution for heating until the metal powder surface tends to melt under the protection of hydrogen, then remaining the temperature for about 20 min to disperse and volatilize the adhesive, and sintering the metal powder into one body and sintering on the substrate, thereby forming a porous metal coating on the surface of the metal substrate. The cover layer with porous technique may be sintered not only on an outer wall surface of the metal pipe but also on an inner wall surface of the metal pipe. Generally, the porous layer has a thickness less than 3 mm, and a porosity of 40%-65%.

Figure 3:
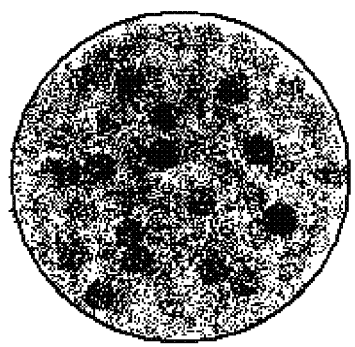
FIG. 3 shows a view showing a surface of sintered copper particle according to an embodiment of the present invention.

The sintered metal particles may be copper particles, copper-plated silver particles or other metal particles to increase surface roughness, increase minute gaps and bubble generation points, so as to effectively enhance boiling. The surface effect view of the CPU cover obtained by sintering copper particles is shown in FIG. 3.

If the metal particles may not be sintered on the heat pipe 3, as a variation of above embodiment, in actual operation, the sintering may be performed on a surface of a thin copper sheet (having a thickness of 0.1 mm or 1 mm or less) which is the same size as the upper surface of the heat pipe 3, and then the thin copper sheet having a sintered surface is welded to the upper surface of the heat pipe 3 by a low temperature welding method, so as to enhance boiling for heat transfer.

The heat pipe 3 is directly mounted above the chip, so as to make a temperature field of the boiling surface uniform, increase the boiling area and vaporization core, strengthen the boiling heat transfer, and reduce the core temperature of the chip.

As a variation of above embodiment, in addition to the formation of the porous structure 4 on the upper surface of the heat pipe 3 by sintering, other methods for constructing a porous structure may be employed. For example, with the wire and mesh as a porous structure, several layers of dense copper mesh (for example, 200 mesh) may be welded on the upper surface of the heat pipe 3 as a porous structure, or several layers of copper mesh may be welded on the thin copper sheet, and the thin copper sheet is then welded to the upper surface of the heat pipe 3 at a low temperature.

There are also some porous structures, formed by such as micro-ribs, micropores, superhydrophobic surfaces, copper foam, etc., may be directly constructed on the upper surface of the heat pipe 3 or on a thin copper sheet, and then a copper foil having a porous structure is welded to the upper surface of the heat pipe 3 by a low temperature welding to enhance boiling for heat transfer.

While the embodiments of the present invention have been described above, the described embodiments are merely illustrative of the embodiments of the present invention, and are not intended to limit the present invention. Any modification and variation in the form and details of the embodiments may be made by those skilled in the art without departing from the spirit and scope of the invention, and maybe ought to fall within the scope of protection of the present application.

What is claimed is:

1. A method for enhancing boiling performance of chip surface, characterized in that, comprising steps of mounting a heat pipe directly above a surface of a chip; forming a porous structure for increasing a vaporization core on an upper surface of an outer wall surface of the heat pipe,
   the heat pipe is a flat heat pipe, and
   the porous structure is formed by a method of sintering metal particles, the method of sintering metal particles comprising: removing rust and grease from the upper surface of the outer wall surface of the heat pipe: applying a layer of adhesive solution including polypropylene, polyethylene, polystyrene, polyethylene terephthalate, polymethacrylic acid, acetone or xylene to the upper surface of the outer wall surface of the heat pipe; applying a metal powder evenly to the upper surface of the outer wall surface of the heat pipe to form a metal powder surface;
   after drying the adhesive solution, placing the heat pipe in a sintering furnace to heat to a temperature at which the metal powder surface tends to melt under protection of hydrogen, remaining the temperature for about 20 minutes to disperse and volatilize the adhesive such that the metal powder is sintered into one body and sintered on the upper surface of the outer wall surface of the heat pipe, thereby forming the porous structure, the porous structure having a thickness less than 3 mm, and a porosity of 40%-65%.

2. The method for enhancing boiling performance of chip surface according to claim 1, characterized in that,
   the metal particles are copper particles or copper silver plated particles.

3. The method for enhancing boiling performance of chip surface according to claim 1, characterized in that,
   the porous structure is directly sintered on the upper surface of the heat pipe.

4. The method for enhancing boiling performance of chip surface according to claim 1, characterized in that, the porous structure is sintered on a thin copper sheet that is welded to the upper surface of the heat pipe by a method of low temperature welding.

5. The method for enhancing boiling performance of chip surface according to claim 1, characterized in that, the porous structure is formed by a wire and mesh structure, a micro-ribbed column, a superhydrophobic surface or a foamed copper.

6. The method for enhancing boiling performance of chip surface according to claim 5, characterized in that, the porous structure is directly formed on the upper surface of the heat pipe.

7. The method for enhancing boiling performance of chip surface according to claim 5, characterized in that, the porous structure is formed on a thin copper sheet that is welded to the upper surface of the heat pipe by a method of low temperature welding.

8. The method for enhancing boiling performance of chip surface according to claim 1, characterized in that, the chip is a CPU chip.

9. The method for enhancing boiling performance of chip surface according to claim 2, characterized in that, the porous structure is directly sintered on the upper surface of the heat pipe.

10. The method for enhancing boiling performance of chip surface according to claim 2, characterized in that, the porous structure is sintered on a thin copper sheet that is welded to the upper surface of the heat pipe by a method of low temperature welding.

\* \* \* \* \*